United States Patent [19]

Bunnell

[11] 4,283,106
[45] Aug. 11, 1981

[54] SYMMETRICAL CONNECTOR FOR SOLAR PANEL ARRAYS

[75] Inventor: Edward D. Bunnell, Palm Harbor, Fla.

[73] Assignee: AMP Incorporated, Harrisburg, Pa.

[21] Appl. No.: 117,748

[22] Filed: Feb. 1, 1980

[51] Int. Cl.³ .......................... H02B 1/04; H02B 1/12
[52] U.S. Cl. .............................. 339/125 R; 339/94 R; 339/276 R
[58] Field of Search .......... 339/125 R, 119 R, 126 RS, 339/132 B, 91 R, 94 R, 94 M, 276 R, 186 R, 17 C

[56] References Cited

U.S. PATENT DOCUMENTS

| | | | |
|---|---|---|---|
| 2,988,725 | 6/1961 | Vallee | 339/126 AS |
| 3,440,592 | 4/1969 | Zelle | 339/125 R X |
| 3,982,963 | 9/1976 | Mahoney | 136/89 |
| 4,019,924 | 4/1977 | Kurth | 136/89 P |
| 4,029,382 | 6/1977 | Koda | 339/94 M |
| 4,167,644 | 9/1979 | Kurth et al. | 136/89 EP |
| 4,189,881 | 2/1980 | Howley | 52/220 |

Primary Examiner—Eugene F. Desmond

Attorney, Agent, or Firm—Russell J. Egan

[57] ABSTRACT

The disclosed symmetrical plug and socket connector may be installed in a solar panel array so that the connector is directed towards the adjacent panel for forming an interconnect by the shortest possible route. The connector socket is an elongated, substantially rectangular housing having a groove formed about the entire periphery thereof adjacent one side and an annular bore extending substantially the length of the housing with its axis parallel to and spaced from the plane defined by the groove. A male contact, having a rectangular solder tab with a tine extending symmetrically and normal thereto, is mounted on the housing with the solder tab lying against a surface of the socket portion and the tine extending into the bore. The plug has a configuration adapted to intermate with the socket portion in an aligned condition and has a crimp ring providing both sealing and strain relief for the high pressure contact terminal carried thereby. The plug also carries sealing means forming a sealed engagement in the mated condition. The connector can include polarizing means as well as latching means.

9 Claims, 7 Drawing Figures

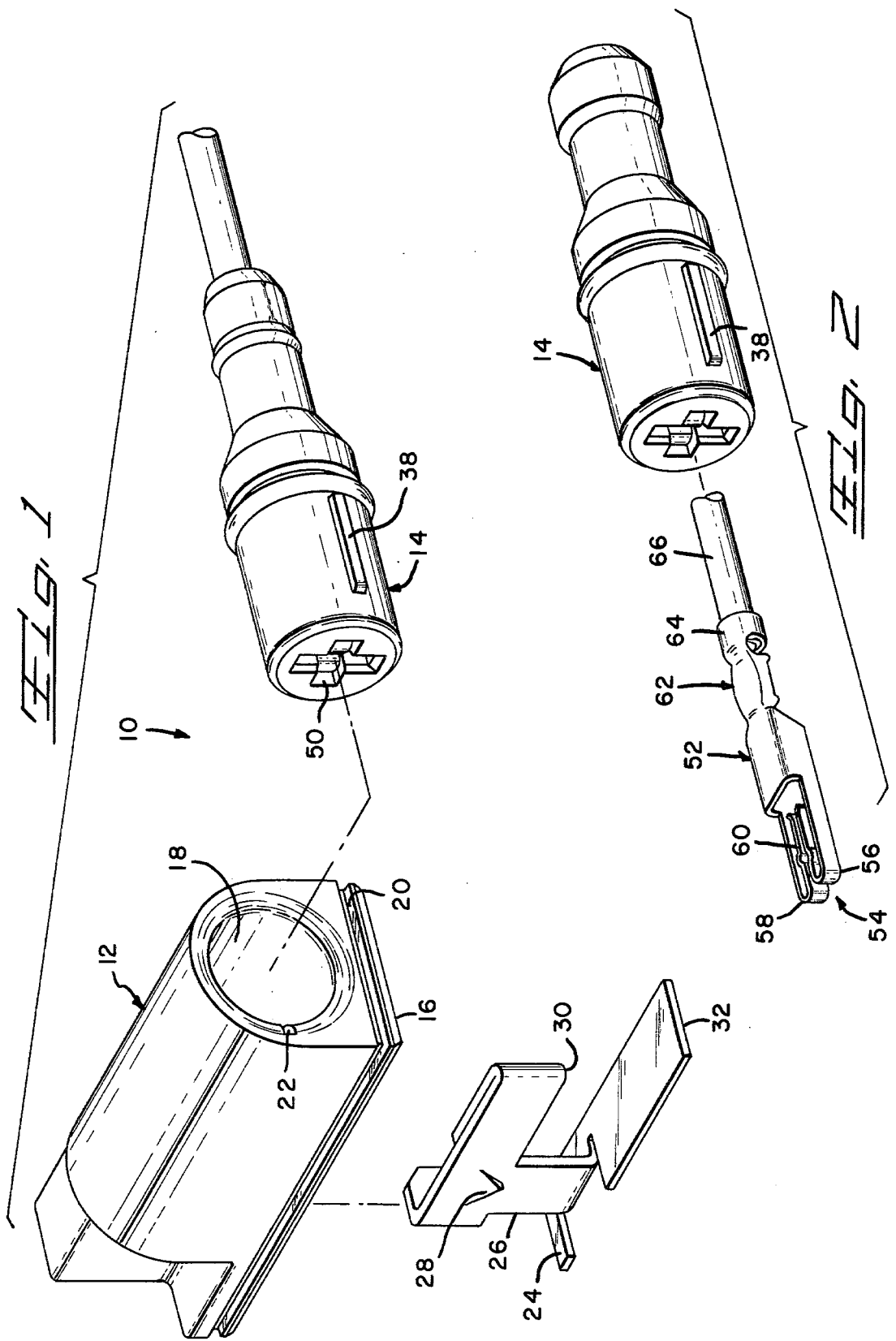

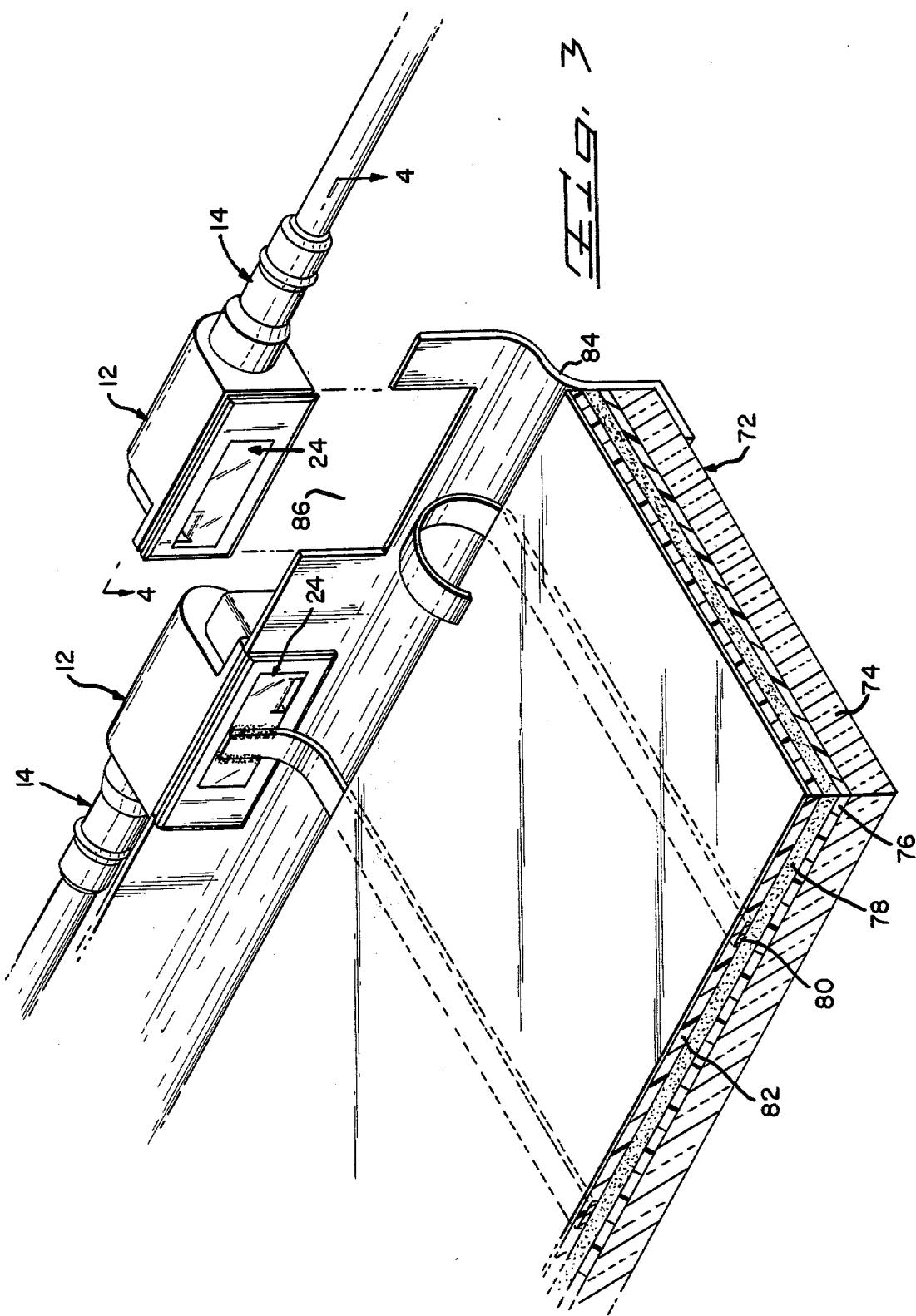

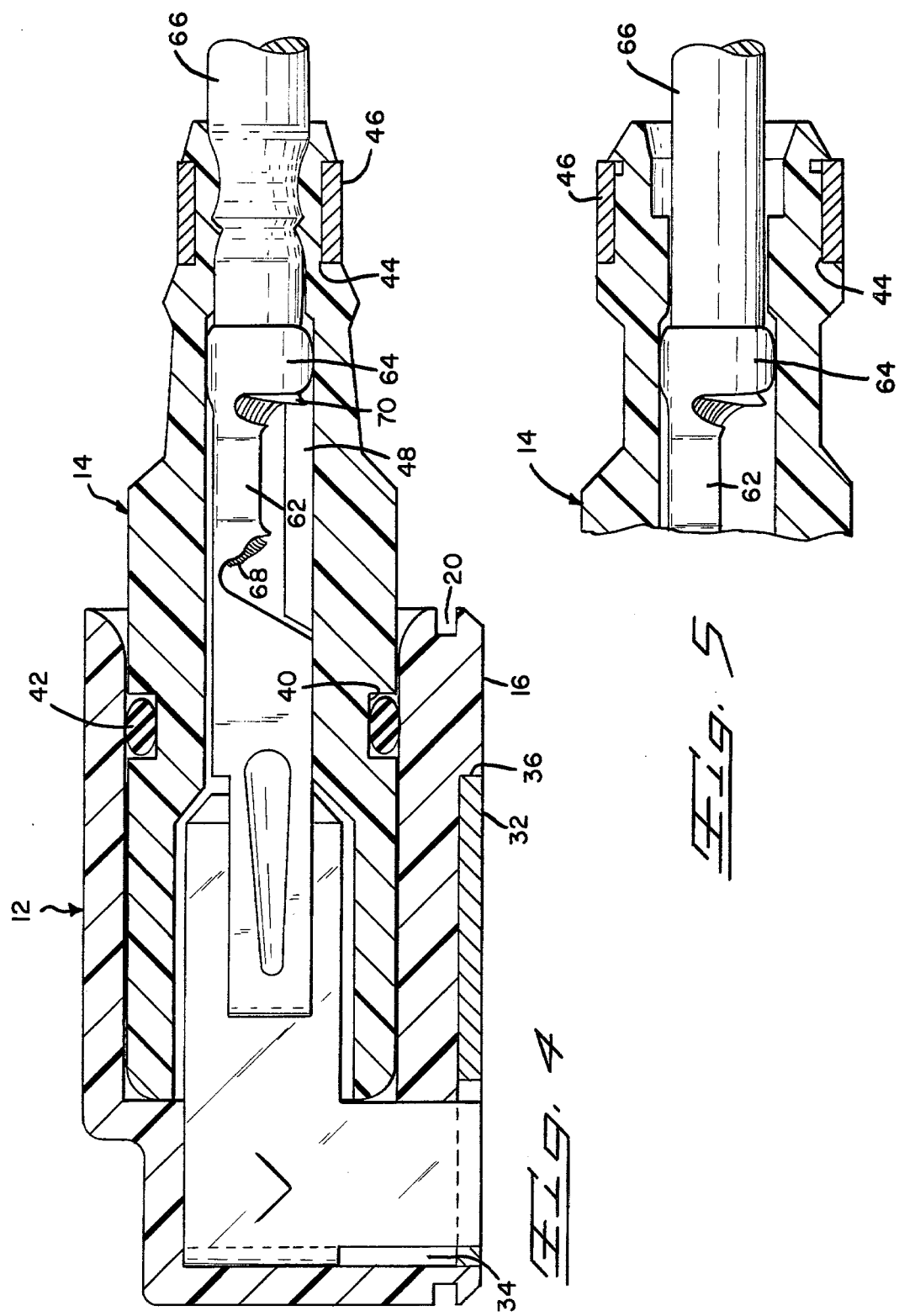

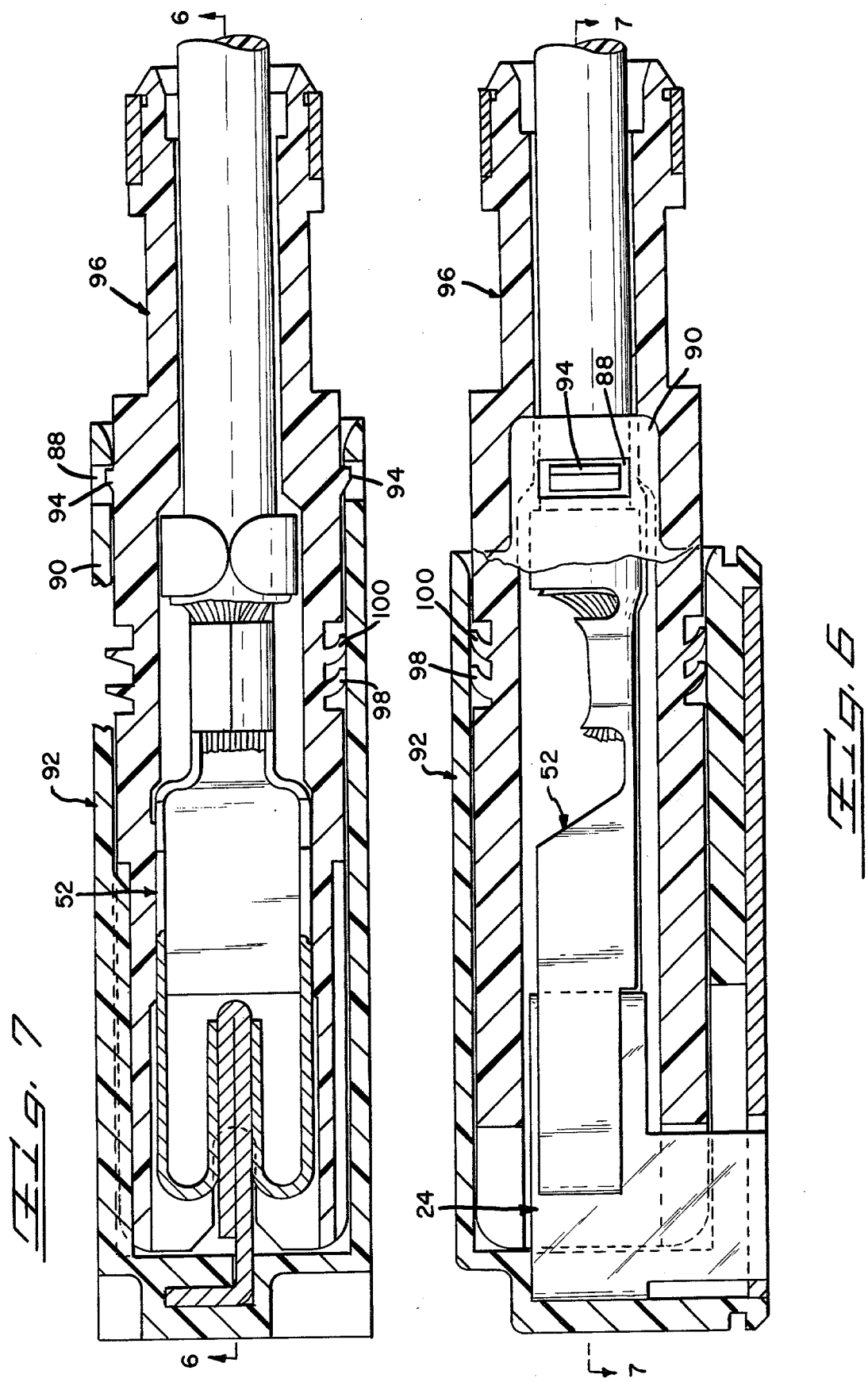

SYMMETRICAL CONNECTOR FOR SOLAR PANEL ARRAYS

BACKGROUND OF THE INVENTION

1. The Field of the Invention

The present invention relates to an electrical connector for interconnecting solar panels and in particular to a connector which is symmetrical with respect to its longitudinal axis allowing mounting in any of a variety of configurations.

2. The Prior Art

There are certain problems that are related to making electrical interconnections with solar panels. The panels generally comprise a frame supporting a plurality of individual solar cells which are interconnected in either a parallel or series configuration. It, therefore, is necessary to provide an electrical interconnect means which allows interconnecting the cells of one panel with the cells of an adjacent panel or with the storage or use device for the electricity being generated. The connection devices used heretofore have been cumbersome in that they are not readily adaptable for the different directions of interconnect, which might be involved in creating either an array of panels in a series hook-up or in a parallel hook-up. The problems caused by this lack of adaptability required the use of interconnecting cables of a wide number of lengths. Further, the connector must be weather tight in a mated condition.

SUMMARY OF THE INVENTION

The subject connector includes a receptacle member and a plug member which can be mounted with any of a variety of orientations by engagement of a peripherial groove in the receptacle member with a panel, the walls of which define a notch. The receptacle member has a profiled bore with an axis parallel to and spaced from the plane defined by the groove. The receptacle member also has a male terminal with a mating tab portion lying in the bore and a solder plate portion, symmetric with respect to the tab, disposed on a surface of the receptacle on the opposite side of the plane from the bore. The mating plug includes a housing profiled for sealed mating with the receptacle and carrying within an axial bore a high pressure terminal matable with the mating tab of the receptacle member and held in the plug member in a sealed and strain relieved fashion by a crimp ring. The plug and receptacle members can also be provided with polarizing and latching means.

It is therefore an object of the present invention to produce a connector for solar panels and the like which connector can be mounted on the panels with a variety of orientations.

It is another object of the present invention to produce an improved electrical connector which is totally sealed in a mounted and mated condition.

It is still another object of the present invention to produce an electrical connector for solar panels which connector can be provided with polarizing means and/or latching means.

It is yet another object of the present invention to produce an electrical connector which is symmetrical about its longitudinal axis so that it can be received in a panel cutout with a variety of orientations and with a solder tab symmetrically exposed on a bottom surface of the receptacle portion.

It is a further object of the present invention to produce an electrical connector for solar panels or arrays which can be readily and economically produced.

The means for accomplishing the foregoing objects and other advantages of the present invention will become apparent to those skilled in the art from the following detailed description taken with reference to the accompanying drawings.

BRIEF DESCRIPTION OF THE DRAWINGS

FIG. 1 is an exploded perspective view of the subject connector;

FIG. 2 is an exploded perspective view of the plug portion of subject connector;

FIG. 3 is a perspective view of a solar panel having a first connector mounted therein in a first orientation and a second connector exploded therefrom and aligned for a second orientation;

FIG. 4 is a longitudinal section through the assembled connector;

FIG. 5 is a detailed section through the crimp ring forming a strain relief and seal for the plug portion;

FIG. 6 is a longitudinal section through an alternate embodiment of the subject connector taken along line 6—6 of FIG. 7; and FIG. 7 is a longitudinal section through the alternate embodiment of the subject invention taken along line 7—7 of FIG. 6.

DETAILED DESCRIPTION OF THE PREFERRED EMBODIMENT

The subject solar cell connector 10 includes a receptacle member 12 and a plug member 14. The receptacle member 12 is a generally elongated member of rigid insulation material having a flat terminal receiving surface 16 and a profiled bore 18 extending parallel to and slightly spaced from the surface 16. Intermediate the bore 18 and the surface 16 there is a groove 20 extending completely around the periphery of the receptacle member. The profiled bore 18 preferably includes at least one polarizing means 22. A male terminal 24 is received in the receptacle member and includes a trunk portion 26 having a locking lance 28 extending therefrom and a mating blade portion 30 extending at right angles to the trunk. The blade portion is shown doubled upon itself to give additional thickness and strength thereto. A solder plate 32 extends from the base of the trunk 26 and is folded such as to be symmetrical with respect to the trunk 26. The blade and trunk portions of the terminal are received through a slot 34 in the base of the receptacle member with the solder plate 32 lying in a profiled recess 36 so as to be substantially coplanar with the surface 16.

The plug member 14 is also formed of an insulative material and has an outer profile adapted to be received within the profiled bore 18 of the receptacle member 12. This profile includes a polarizing means 38 on the plug member which mates with polarizing means 22 on the receptacle member. The plug member also includes a first annular groove 40, with an O-ring seal 42 mounted therein and a second annular groove 44, near the rear end of the plug member, with a metal crimp ring 46 therein. The plug member has an annular bore 48 having an X or cross shaped opening 50 at the mating end thereof. A terminal 52 carried by the plug member has a mating portion 54 formed by a pair of cantilever beams 56, 58 inwardly turned upon themselves defining a slot 60 therebetween and sized to grip the blade 30 therein. The terminal 52 also includes a crimp barrel 62 and a strain relief crimp 64.

The receptacle member 12 is assembled by simply inserting the terminal 24 through the slot 34 in the bottom surface 16 until the plate 32 is fully seated in the recess 36. The locking lance 28 will secure the terminal 24 in position. The plug member 14 is assembled by passing the conductor 66 through the bore 48 and then crimping the terminal 52 on the exposed wires 68 and insulation 70 of the conductor. The conductor is then withdrawn to pull the terminal into the bore 48 through opening 50 until the terminal is fully seated therein. The crimp ring 46 is then crimped to both secure the terminal in the plug member as well as to form a tight seal in the rear end thereof.

The subject connector is used in connection with a solar panel 72 of the type generally shown in FIG. 3. The panel 72 includes a glass base 74, a conductive web schematically shown by layer 76, a plurality of solar cells schematically shown as layer 78, a plurality of buss bars 80 interconnecting the cell 78 with a tab portion thereof extending to the edge of the panel, and insulative web 82 covering the cells and the buss bars. The entire panel 72 is enclosed in a frame 84 formed of sheet metal formed with an upstanding side edge portion defining a plurality of notches or slots 86, each aligned with a respective buss bar 80. The subject connector 10 is mounted in each respective slot 86 with the receptacle member 12 oriented with the bore 18 opening in the desired direction. FIG. 3 shows how the orientation is readily established by inserting the sheet metal of the frame into the peripherial slot 20 of the receptacle member 12. When the receptacle member is fully in place, the buss 80 is laid against the plate portion 32 of the terminal 24 and soldered thereto to establish mechanical and electrical connection therebetween. This also serves to fix the receptacle member in the frame. Interconnect cables can be made up in fixed lengths and used to interconnect various panels in a parallel or series arrangement as desired by simply mating the plug members to the respective receptacle members.

FIGS. 6 and 7 show an alternate embodiment of the subject connector which differs from the above described connector in the provision of latching apertures 88 formed in extensions 90 of the receptacle member 92 and latching lugs 94 formed on the plug member 96. Engagement of the lugs in the apertures serves to latchingly secure the plug member in the receptacle member. The members can be disconnected by spreading the extensions 90 sufficiently to free the lugs from the apertures and withdrawing the plug member from the receptacle member. This latching arrangement could also substitute for the previously discussed polarizing means 22, 38.

The alternate embodiment also differs from the primary embodiment by the replacement of the previously described O-ring seal 42 with a series of integral radial flanges 98, 100 having a larger outer diamater than that of plug member 96. The flanges 98, 100 make a wiping seal when received in the bore 18 of the receptacle member 92.

The present invention may be subject to many modifications and changes without departing from the spirit of essential characteristics thereof. The present embodiment should therefore be considered in all respects as illustrative and not restrictive of the scope of the invention.

What is claimed is:

1. An electrical connector capable of being mounted in a panel with any of a variety of orientations, said connector comprising:
    a receptacle member formed by an elongated body of insulation material defining a planar surface, a profiled bore extending parallel to and spaced from the planar surface, a peripheral groove formed in said member intermediate said bore and said surface and a slot interconnecting said surface with said bore;
    a first terminal having a trunk portion, a blade portion extending at a right angle from said trunk portion and a solder tab extending symmetrically with respect to said trunk and at right angles to the plane formed by said blade and said trunk, said first terminal being mounted in said receptacle member with said blade portion lying in said bore, said trunk portion passing through said slot and said solder tab lying adjacent said surface,
    a plug member formed by an elongated body of insulation material matable within the bore of said receptacle member and including an axial bore, sealing means adapted to make wiping engagement with said bore of said receptacle member, a peripheral recess in a rear portion, and a crimp ring mounted in said recess; and
    a second terminal adapted to be crimp therefor to a conductor passed into the bore of said plug member, said terminal having a mating portion adapted to engage said blade of said first terminal, said second terminal being held in said plug member by crimping of said crimp ring which forms an environmentally tight seal about said conductor as well as a strain relief therefore.

2. An electrical connector according to claim 1 further comprising:
    locking means adapted to secure said receptacle member and said plug member together in a mated condition.

3. An electrical connector according to claim 1 wherein said first terminal further comprises:
    a locking lance adapted to secure said first terminal in said receptacle member.

4. An electical connector according to claim 1 wherein said planar surface further comprises:
    a profiled recess adapted to receive therein said solder tab of said first terminal so as to be coplanar with said surface.

5. An electrical connector according to claim 1 wherein said second terminal further comprises:
    a crimp barrel having a first portion adapted to crimpingly engage said conductor and a second portion adapted to crimpingly engage insulation surrounding said conductor.

6. An electrical connector according to claim 1 wherein said mating portion of said second terminal comprises:
    a pair of cantilever arms folded upon themselves to define therebetween a slot adapted to embrace the blade portion of said first terminal.

7. An electrical connector according to claim 1 further comprising:
    polarizing means on said plug member and said receptacle member allowing mating in only a single condition.

8. An electrical connector according to claim 1 wherein said sealing means comprises:
    a second peripherial recess in said plug member; and an O-ring mounted in said second recess adapted to make wiping engagement with the bore of said receptacle member forming a seal therebetween.

9. An electrical connector according to claim 1 wherein said sealing means comprises:

at least one radially extending peripherial flange on said plug member, said flange having a diameter greater than the bore of said receptacle member whereby a wiping seal is established upon mating of said members.

* * * * *